United States Patent [19]

Yokogawa

[11] 3,903,590

[45] Sept. 9, 1975

[54] MULTIPLE CHIP INTEGRATED CIRCUITS AND METHOD OF MANUFACTURING THE SAME

[75] Inventor: Syunzi Yokogawa, Yokohama, Japan

[73] Assignee: Tokyo Shibaura Electric Co., Ltd., Kawasaki, Japan

[22] Filed: Mar. 7, 1974

[21] Appl. No.: 449,085

[30] Foreign Application Priority Data

Mar. 10, 1973 Japan .............................. 48-30099

[52] U.S. Cl. ...................... 29/577; 29/589; 29/591; 29/588

[51] Int. Cl.[2] .. B01J 17/00; H01L 1/16; H01L 1/24; H01L 7/68

[58] Field of Search .......... 29/577, 589, 576 S, 588, 29/591

[56] References Cited

UNITED STATES PATENTS

| | | | |
|---|---|---|---|
| 3,405,442 | 10/1968 | Caracciolo | 29/576 S |
| 3,614,832 | 10/1971 | Chance | 29/577 |
| 3,691,628 | 9/1972 | Kim | 29/577 |
| 3,805,375 | 4/1974 | LaCombe | 29/577 |

*Primary Examiner*—W. Tupman
*Attorney, Agent, or Firm*—Cushman, Darby & Cushman

[57] ABSTRACT

In a multiple chip integrated circuit, a plurality of semiconductor chips each carrying contact electrodes are partially embedded in a metal substrate and a dielectric layer is overlaid on the substrate with the semiconductor chips projected through windows of the dielectric layer. A first conductive layer is formed on the dielectric layer in a predetermined pattern and a layer of thermoplastic resin formed with windows is applied to cover the first conductive layer and the semiconductor chips. A second conductive layer of a predetermined pattern is applied on the layer of thermoplastic resin for electrically connecting the contact electrodes on the semiconductor chips to the first conductive layer through the windows of the layer of thermoplastic resin.

3 Claims, 12 Drawing Figures

MULTIPLE CHIP INTEGRATED CIRCUITS AND METHOD OF MANUFACTURING THE SAME

This invention relates to integrated circuits and more particularly to hybrid type integrated circuits in which a plurality of semiconductor chips are integrally mounted on a single substrate and a method of manufacturing the same. The term "semiconductor chips" as used herein is intended to include all forms of the miniaturized electronic components such as monolithic integrated circuits, monolithic chips, hybrid devices, etc.

Among integrated circuits wherein a plurality of elements are integrally mounted on a single substrate are included monolithic devices and hybrid devices and a large scale integration of these devices has been desired in recent years.

However, in the monolithic type device, a silicon monocrystalline chip, for example, is used as the substrate and all active components are formed thereon by diffusion, epitaxial and photolithographic technique. Further, certain types of passive components are also integrally formed on a silicon chip.

For this reason, not only the functions of the components are limited but also even only one defective component results in a rejection of the entire chip.

On the contrary, in the hybrid type, since individual chips are tested and only satisfactory chips are interconnected to form a large scale integrated circuit the yield of satisfactory multiple chip integrated circuits can be improved. Moreover, as it is possible to freely select chips having desired functions, it is possible to increase the degree of feedom when designing such integrated circuits.

As one type of the hybrid type devices a device termed "Semiconductor in Thermoplastic on Dielectric" has been proposed, in which semiconductor chips are embedded in a thermoplastic material mounted on a dielectric and the chips are electrically connected by wiring conductors formed on the thermoplastic material. However, such device is not yet actually manufactured because of its problem encountered during manufacture thereof. More particularly, when the semiconductor chips are embedded in the thermoplastic material under pressure it is difficult to correctly position the chips due to the flow of the thermoplastic material.

An alternative construction of the "Thermoplastic on Dielectric" type has been proposed wherein the semiconductor chips are arranged on a wired ceramic, the whole assembly is covered by a layer of dielectric material and the wirings on the ceramic and the contact electrodes of respective chips are electrically interconnected by conductors extending through windows provided in the layer of dielectric material. However, this alternate construction is also not suitable for practical use as will be discussed later.

It is an object of this invention to provide a multiple chip integrated circuit capable of reducing the thickness of a thermoplastic film enclosing a plurality of semiconductor chips partially embedded in a metal substrate.

Another object of this invention is to provide an improved multiple chip integrated circuit having a construction capable of readily dissipating the heat generated by the semiconductor chips.

Still another object of this invention is to provide a method of manufacturing a multiple chip integrated circuit wherein the heights of the contact electrodes of a plurality of semiconductor chips may be made equal once these chips are partially embedded in a metal substrate even when they have different size.

To accomplish these and further objects, in accordance with this invention a plurality of semiconductor chips each carrying at least one contact electrode are partially embedded in a metal substrate, and a dielectric layer is overlaid on the substrate with the semiconductor chips projected through windows of the dielectric layer. A first conductive layer is formed on the dielectric layer in a predetermined pattern and a layer of thermoplastic resin formed with windows is applied to cover the first conductive layer and the semiconductor chips. A second conductive layer is applied on the layer of thermoplastic resin for electrically connecting the contact electrodes on the semiconductor chips and the first conductive layer through the windows of the layer of thermoplastic resin.

The upper surfaces of the contact electrodes on the semiconductor chips and of the first conductive layer are flush so that it is easy to electrically connect the chips and the conductive layer, dissipation of the heat generated by the semiconductor chips is improved greatly by the metal substrate.

Further objects and advantages of the invention can be more fully understood from the following detailed description when taken in conjunction with the accompanying drawings, in which.

Figure 2A:
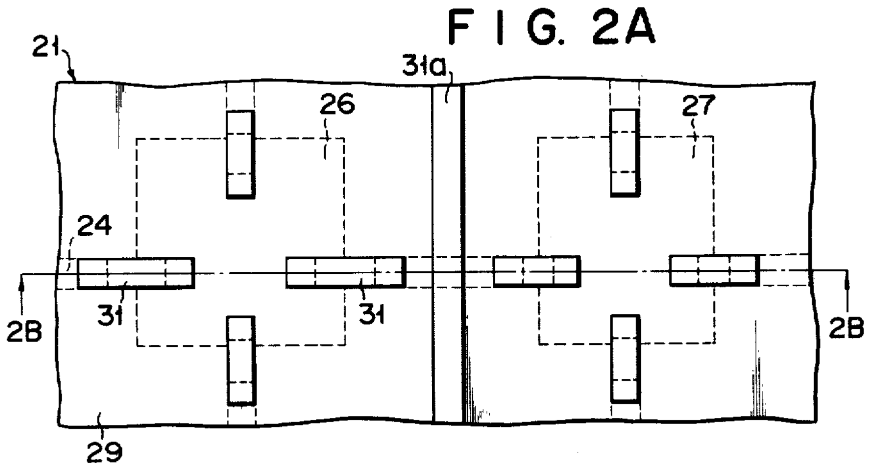
FIG. 2A is a plan view of a portion of the multiple chip integrated circuit embodying the invention with the thermoplastic layer removed.
Figure 2B:
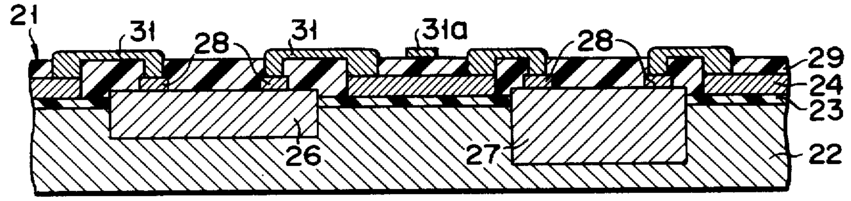
FIG. 2B is a sectional view of the integrated circuit shown in FIG. 2A taken along a line 2B—2B.
Figure 2C:
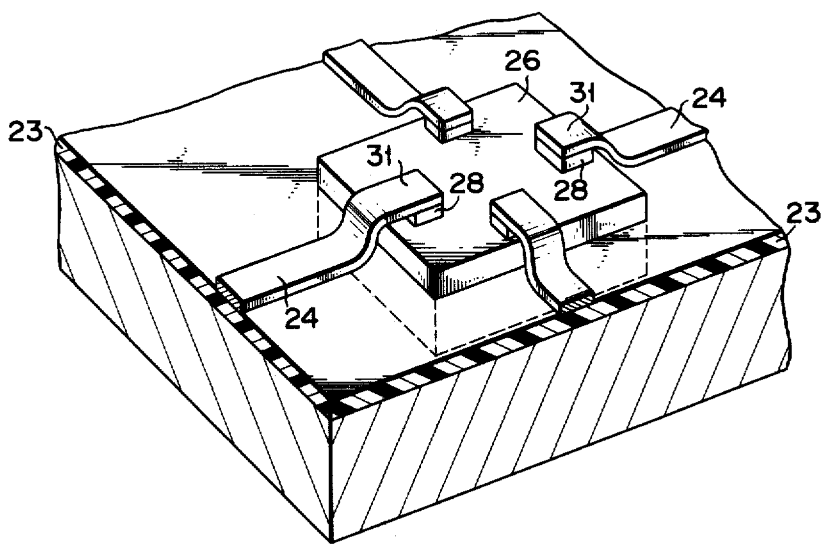
FIG. 2C is a perspective view of a portion of the integrated circuit shown in FIG. 2A.
Figure 3:
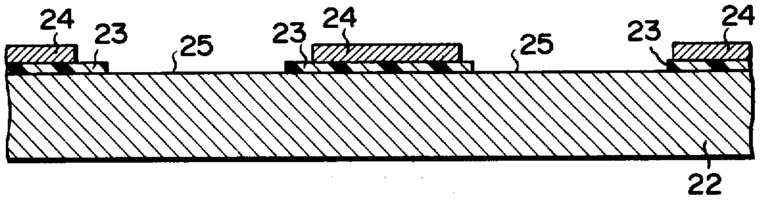
Figure 8:
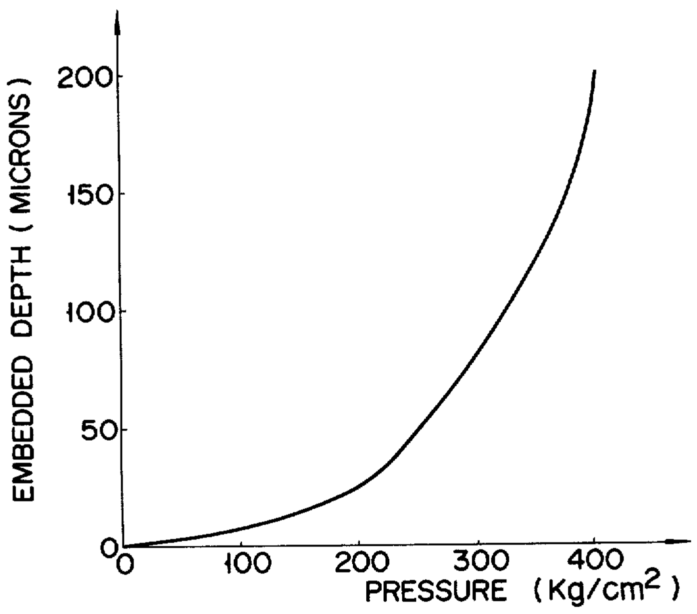
Figure 9:
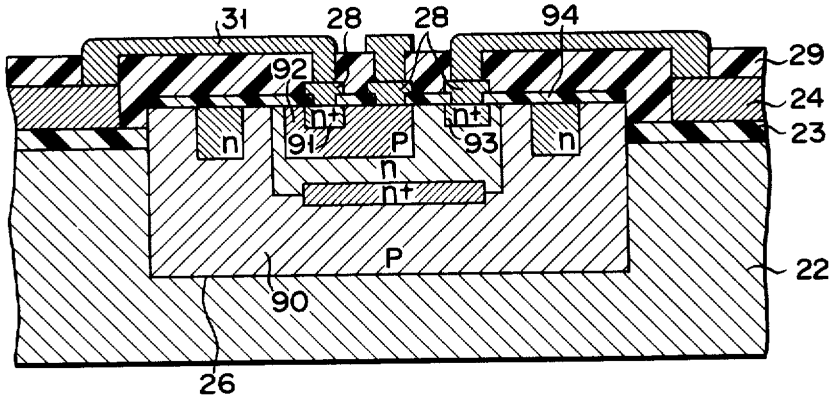

FIGS. 3 to 7 inclusive are sectional views showing successive steps of manufacturing the multiple chip integrated circuit shown in FIGS. 2A, 2B and 2C;

FIG. 8 is a plot showing a relationship between the embedded depth and the pressure for partially embedding the semiconductor chips into a substrate; and FIG. 9 shows a section of a planar type transistor embodying the invention.

Figure 1A:
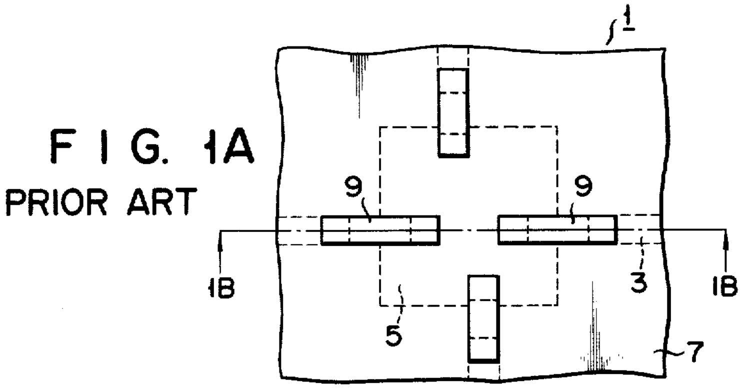
FIG. 1A PRIOR ART
FIG. 1A is a plan view of a portion of a piror art multiple chip integrated circuit.
Figure 1B:
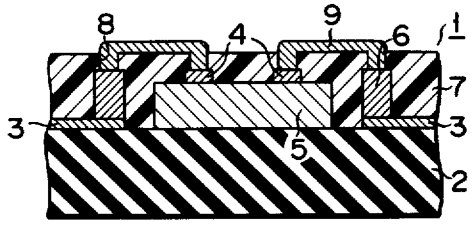
FIG. 1B PRIOR ART
FIG. 1B is a sectional view of the multiple chip integrated circuit shown in FIG. 1A taken along a line 1B—1B.

To have better understanding of the invention a conventional multiple chip integrated circuit 1 shown in FIGS. 1A and 1B will firstly be described. As shown a layer of conductor 3 of a predetermined pattern is provided on the upper surface of a dielectric substrate 2. A plurality of semiconductor chips 5 (only one is shown) having contact electrodes 4 on one surface are also mounted on the dielectric substrate 2 with the contact electrodes faced upper. Relatively thick electrode mesas 6 are secured to the conductor layer 3 at predetermined positions thereof. The electrode mesas 6 are preferably made of gold and their height is selected to be substantially the same as the height of the semiconductor chips 5. The electrode mesas 6, conductor layer 3 and semiconductor chips 5 are covered by a thermoplastic layer 7 which is provided with windows or openings 8 at the portions thereof corresponding to the contact electrodes 4 and electrode mesas 6. A second conductor 9 of a predetermined pattern extends through the windows of the layer 7 to electrically interconnect the semiconductor chips 5 and electrode mesas 6.

In the construction described above wherein a plurality of semiconductor chips are mounted on a dielectric substrate it is necessary to make the height of the electrode mesas 6 to be equal to the height of the semiconductor chips 5. If the heights of the mesas and the chip are not equal, it is difficult to electrically interconnect them. In the integrated circuit of the type described above, various types of semiconductor chips are generally used and semiconductor chips of different type generally have different thickness so that it is extremely expensive to prepare a plurality of mesas having different height.

To prepare an integrated circuit having a construction as above described, a plurality of chips are mounted on an insulative substrate made of aluminum oxide for example, and after placing a thermoplastic material on the assembly, they are pressed together by using a pressing jig under a temperature of several hundred degrees. For this reason, if the platens of the jig are not parallel, or the thickness or size of the chips is not equal or the substrate is not sufficiently flat, the thickness of the thermoplastic layer 7 would not be equal, in the worst case the thermoplastic layer 7 would fracture. Furthermore, in order to provide electrical connections, windows must be formed through the thermoplastic layer 7 usually by photolithographic technique. In order to accurately form conductor patterns on the thermoplastic layer it is necessary to make uniform the thickness thereof and to make it considerably thin.

Furthermore, as the heat generated by the semiconductor chips is dissipated through the dielectric substrate, the efficiency of heat dissipation is extremely low. Consequently, when the elements are integrated at a high density, heat dissipation presents a serious problem.

A preferred embodiment of the multiple chip integrated circuit of this invention is illustrated in FIGS. 2A, 2B and 2C. Successive steps of manufacturing the integrated circuit will firstly be described with reference to FIGS. 3 to 7 inclusive.

A metal substrate 22 of aluminum having a thickness of 2 mm, for example, is prepared. The metal substrate of this invention can also be made of gold copper, indium or the like. However aluminum is preferred because of its light weight, chemical stability and easiness of working. A dielectric layer 23 is formed on the predetermined portions of the upper surface of the substrate 22, and portions of the dielectric layer are removed as by selective etching technique to form windows 25 thus partially exposing the surface of the substrate 22. In one example, the dielectric layer comprises a layer of polyimide resin having a thickness of 50 microns and capable of resisting against a high temperature of about 350°C. In addition to polyimide resin other heat resistant resins can also be used as the dielectric layer. Further, as is well known in the art the surface layer of the aluminum substrate may be oxidized by alumilite technique to form a layer of aluminum oxide and to use this layer as the dielectric layer.

Figure 4:
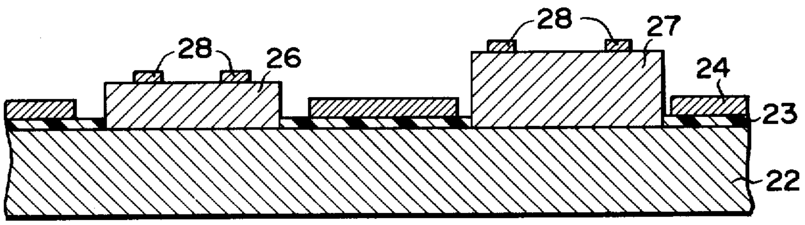

An electroconductive film, not shown, for example, a copper film having a thickness of 10 microns is formed on the dielectric layer 23, and then a first conductive layer 24 of a predetermined pattern is formed on the copper film as by conventional photolithographic technique. The electroconductive film may be formed by forming a thin film acting as nuclei by vacuum deposition technique and then electroplating a relatively thick metal film. In addition to copper the electroconductive film can also be made of alloys or laminations of Cr-Cu, Ti-Cu, Cr-Au, Ti-Au, Cr-Cu-Au and Ti-Cu-Au and gold or aluminum. Then semiconductor chips 26 and 27 are mounted on the exposed surface portions of the metal substrate 22, as shown in FIG. 4. Specific construction of these semiconductor chips will be described later, and the thickness of the chips ranges from about 100 to 200 microns. In the example shown in FIG. 4, one chip 26 is thinner than the other 27. When securing the chips 26 and 27 on the exposed surface portions of the metal substrate 22, if necessary an organic binder having a thickness of about several tens Angstrome units may be interposed therebetween. On the upper sides of the semiconductor chips 26 and 27 are positioned contact electrodes 28 for each chip.

After mounting the semiconductor chips 26 and 27 on the metal substrate 22, the chips are forced toward the substrate by means of a pressing jig made of stainless steel, not shown. To facilitate the embedding of the chips in the metal plate, the jig is provided with a suitable heater so as to heat the interface between the chips and the substrate to a temperature of 200° to 350°C, preferably from 300° to 350°C. To prevent the fracture of the semiconductor chips at the time of pressing by the jig, it is advantageous to interpose a resilient film of polyimide, for example, between the chips and the jig, an optimum thickness of the resilient film being about 12.5 microns.

Figure 5:
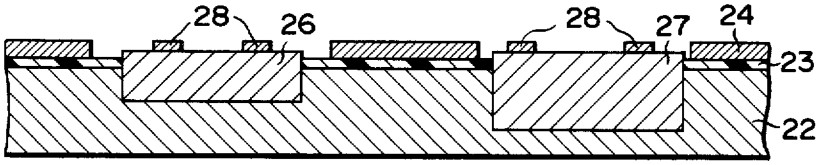

When pressed in this manner, the semiconductor chips are partially embedded in the metal substrate, such embedding being continued until the upper surfaces of the semiconductor chips become the same level as those of the first conductor layer 24. It was found that a pressure of about 370 kg/cm$^2$ is required to embed ten semiconductor chips each having dimensions of 2 mm × 2 mm and an average thickness of 200 microns in an aluminum substrate. FIG. 8 is a plot showing a relationship between the embedded depth of the chips and the pressure for embedding when the chips are heated to 300°C. After embedding the chips in the aluminum substrate in this manner, the resilient layer which has been interposed between the pressing jig and the chips is removed, whereby an assembly as shown in FIG. 5 is obtained in which the upper surfaces of the contact electrodes 28 on the embedded chips, and of the first conductive layer 24 lie at the same level.

Figure 6:
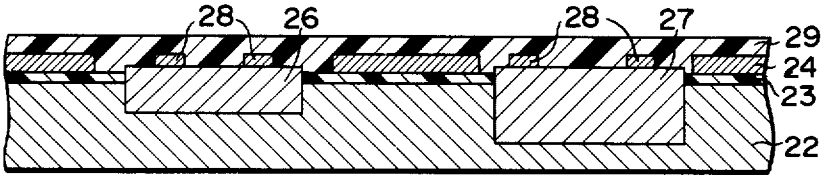

Then, an insulating film 29 of thermoplastic resin having a thickness of about 12.5 microns for example, is applied to cover the one side of the assembly. Fluorinated ethylene propylene is advantageous to use as the thermoplastic film because it is chemically stable, has a small dielectric loss and is easy to work. The thermoplastic film may be applied in the following manner. More particularly, the aluminum substrate embedded with semiconductor chips is clamped between a pair of silicone rubber sheets and the assembly is pressed by a pressing jig at a temperature of 100° to 200°C, preferably not higher than 150°C, thus bonding the film of fluorinated ethylene propylene to the aluminum substrate which does not melt at a temperature of about 150°C. The pressure is relieved and the temperature of the assembly is elevated to from 280° to 350°C, preferably 280°C. At these elevated temperatures, the film of fluorinated ethylene propylene melts to spread over the entire surface of the aluminum substrate. Then the assembly is cooled down to a room temperature. In this manner an assembly as shown in FIG. 6 is obtained wherein the first conductive layer 24, semiconductor chips 26 and 27, and contact electrodes 28 are covered by a relatively thin layer 29 of thermoplastic resin having substantially uniform thickness.

Figure 7:
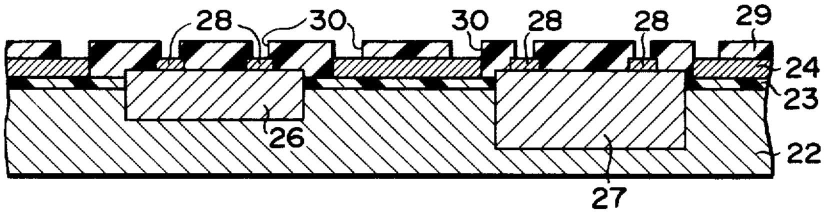

Then windows are formed through the film 29 of fluorinated ethylene propylene at portions corresponding to the contact electrodes 28 of the semiconductor chips 26 and 27 and the portions of the first conductive layer 24 by conventional photolithographic technique utilizing a photo resist, thereby completing a structure shown in FIG. 7.

Finally, an electrode material is applied to cover the insulating film 29 to protrude into windows 30. Then the electrode material is photoetched to form a second conductive layer 31 of a predetermined pattern through which the first conductive layer and the electrodes of the semiconductor chips are electrically connected thus completing a multiple chip integrated circuit as shown in FIGS. 2A to 2C, in which electrical connection of various elements have been made. In one example, the second conductive layer 31 comprises a lamination of a titanium layer and a copper layer having a total thickness of 3 microns. The second conductive layer can also be made of such alloys or laminations of Cr-Cu, Ti-Cu, Cr-Au, Ti-Au, Cr-Cu-Au and Ti-Cu-Au, and can be formed by vapour depositing one material and then electroplating a second layer thicker than the layer of the first material. The total thickness of the layers is selected to be several microns because if the second conductive layer were formed by vapour deposition technique, the vapour of the metal would inter windows. Further, it is difficult to form a thick metal layer by only vapour deposition technique. Where the integrated circuit of this invention is used in a microwave circuit the thickness of the electrode material should be at least several microns by taking into consideration the skin depth effect of the microwave.

Although the concrete construction of the semiconductor chips 26 and 27 has not be shown in the foregoing description, the semiconductor chips may be constructed as shown in FIG. 9 in which the same or identical elements as those shown in FIGS. 7 to 9 are designated by the same reference numerals. In the semiconductor chip 26 shown in FIG. 9, an emitter region 91, a base region 92 and a collector region 93 are formed in a P type silicon substrate 90 and these regions are covered by an insulative film 23. In addition to a planar type transistor shown in FIG. 9, in an ordinary integrated circuit since a substrate (in the planar type transistor illustrated, the P type silicon substrate 90) is used as a common earth, it is possible to embed a plurality of semiconductor chips in a conductive aluminum substrate 22. Of course it will be clear that the invention is also applicable to metal oxide type semiconductor elements.

In FIGS. 2A and 2B, a conductor 31*a* is a cross-over wiring conductor which does not interconnect semiconductor chips 26 and 27, thus illustrating a multilayer wiring of a multiple chip integrated circuit of this invention.

As has been described in detail in connection with a preferred embodiment, according to this invention since a plurality of semiconductor chips are embedded in a metal substrate it is easy to electrically interconnect the chips and the dissipation of the heat generated thereby is improved.

What we claim is:

1. A method of manufacturing an integrated circuit comprising the steps of forming a first insulating layer on the surface of a metal substrate, the insulating layer having windows to expose the surface portions of the substrate, mounting a first conductive layer on the first insulating layer in a predetermined pattern, mounting a plurality of semiconductor chips having at least one contact electrode provided on the top side thereof on the exposed portions of the substrate through the windows in the first insulating layer, downwardly pressing the semiconductor chips to partially embed the chips in the metal substrate, overlying the semiconductor chips and first conductive layer with a second insulating layer of thermoplastic resin having windows at portions corresponding to the contact electrodes of the semiconductor chips and to predetermined portions of the first conductive layer, and mounting a second conductive layer on the second insulating layer in a predetermined pattern for electrically connecting the contact electrodes of the semiconductor chips to the predetermined portions of the first conductive layer through the windows in the second insulating layer.

2. A method of manufacturing an integrated circuit according to claim 1 wherein the step of pressing the semiconductor chips is carried out during heating the chips at a temperature of 200° to 300°C.

3. A method of manufacturing an integrated circuit according to claim 2 wherein the chips are partially embedded in the metal substrate with the top surface locating substantially same level as the first conductive layer.

* * * * *